(12) United States Patent
Kuan et al.

(10) Patent No.: US 10,714,528 B2
(45) Date of Patent: Jul. 14, 2020

(54) CHIP PACKAGE AND MANUFACTURING METHOD THEREOF

(71) Applicant: XINTEC INC., Taoyuan (TW)

(72) Inventors: Hsin Kuan, Zhubei (TW); Shih-Kuang Chen, Kaohsiung (TW); Chin-Ching Huang, Zhudong Township (TW); Chia-Ming Cheng, New Taipei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 16/178,483

(22) Filed: Nov. 1, 2018

(65) Prior Publication Data

US 2019/0140012 A1     May 9, 2019

Related U.S. Application Data

(60) Provisional application No. 62/582,564, filed on Nov. 7, 2017.

(51) Int. Cl.
| | |
|---|---|
| *H01L 27/146* | (2006.01) |
| *H01L 23/00* | (2006.01) |
| *H01L 23/31* | (2006.01) |
| *H01L 21/56* | (2006.01) |

(52) U.S. Cl.
CPC .... *H01L 27/14636* (2013.01); *H01L 23/3128* (2013.01); *H01L 24/02* (2013.01); *H01L 24/13* (2013.01); *H01L 24/24* (2013.01); *H01L 24/73* (2013.01); *H01L 24/82* (2013.01); *H01L 24/97* (2013.01); *H01L 27/1469* (2013.01); *H01L 27/14618* (2013.01); *H01L 27/14632* (2013.01); *H01L 27/14634* (2013.01); *H01L 27/14687* (2013.01); *H01L 21/561* (2013.01); *H01L 21/568* (2013.01); *H01L 2224/0236* (2013.01); *H01L 2224/02371* (2013.01); *H01L 2224/02381* (2013.01); *H01L 2224/13024* (2013.01); *H01L 2224/24147* (2013.01); *H01L 2224/32145* (2013.01); *H01L 2224/73267* (2013.01); *H01L 2224/82951* (2013.01)

(58) Field of Classification Search
CPC ............. H01L 27/14636; H01L 21/568; H01L 21/563; H01L 21/6836; H01L 27/14618
See application file for complete search history.

(56) References Cited

U.S. PATENT DOCUMENTS

2009/0289317 A1* 11/2009 Yu ..................... H01L 27/14618
                                                                             257/433

* cited by examiner

*Primary Examiner* — Changhyun Yi
(74) *Attorney, Agent, or Firm* — Liu & Liu

(57) ABSTRACT

A chip package includes a chip structure, a molding material, a conductive layer, a redistribution layer, and a passivation layer. The chip structure has a front surface, a rear surface, a sidewall, a sensing area, and a conductive pad. The molding material covers the rear surface and the sidewall. The conductive layer extends form the conductive pad to the molding material located on the sidewall. The redistribution layer extends form the molding material that is located on the rear surface to the molding material that is located on the sidewall. The redistribution layer is in electrical contact with an end of the conductive layer facing away from the conductive pad. The passivation layer is located on the molding material and the redistribution layer. The passivation layer has an opening, and a portion of the redistribution layer is located in the opening.

19 Claims, 18 Drawing Sheets

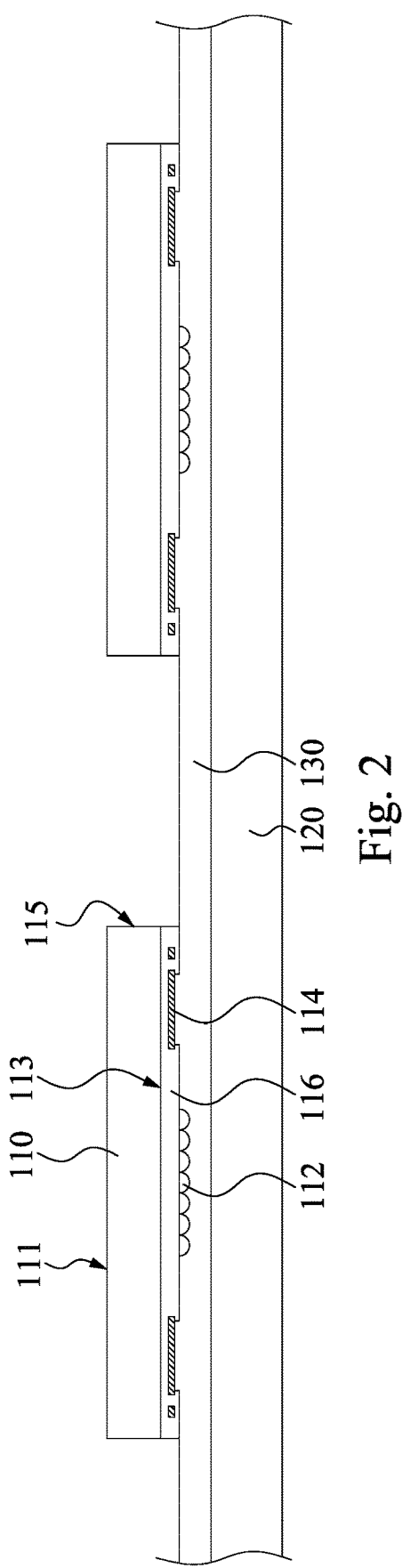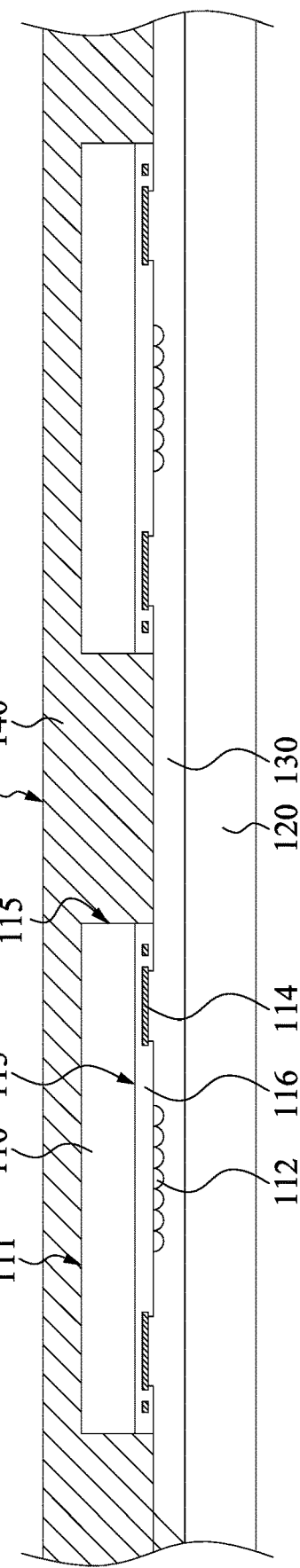

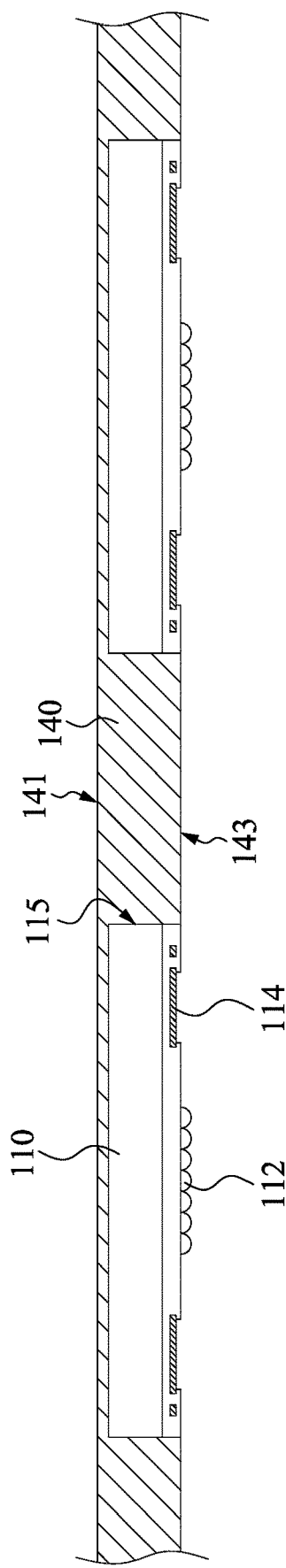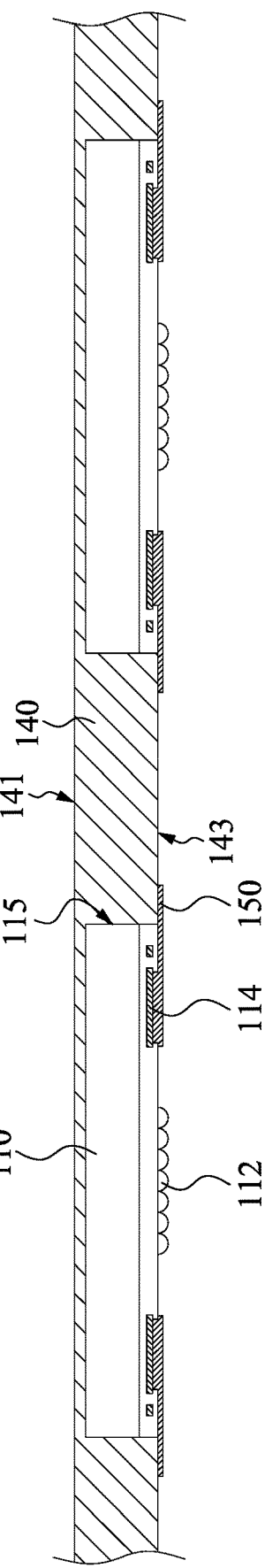

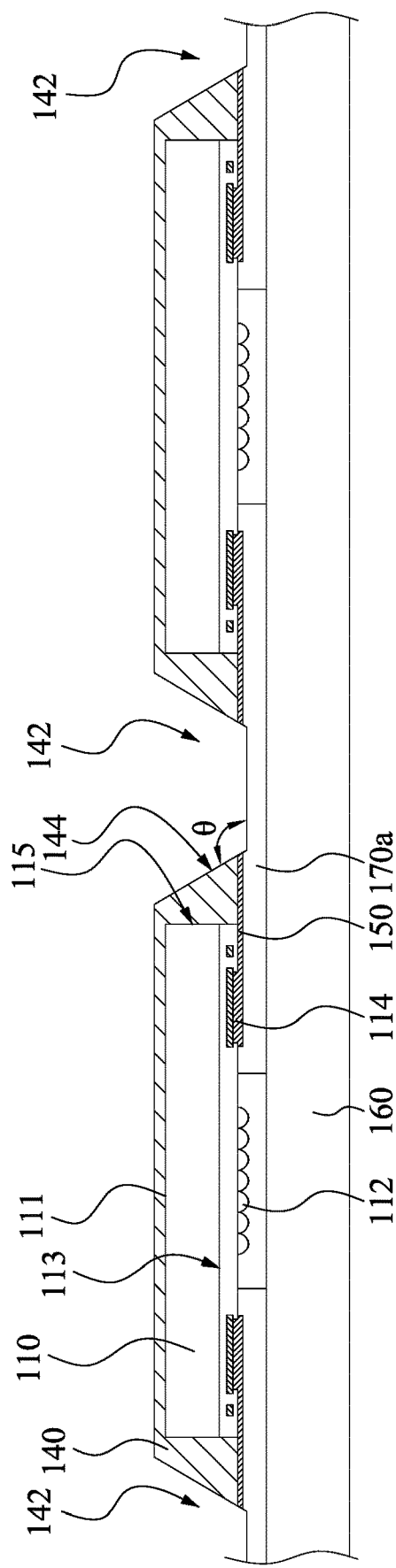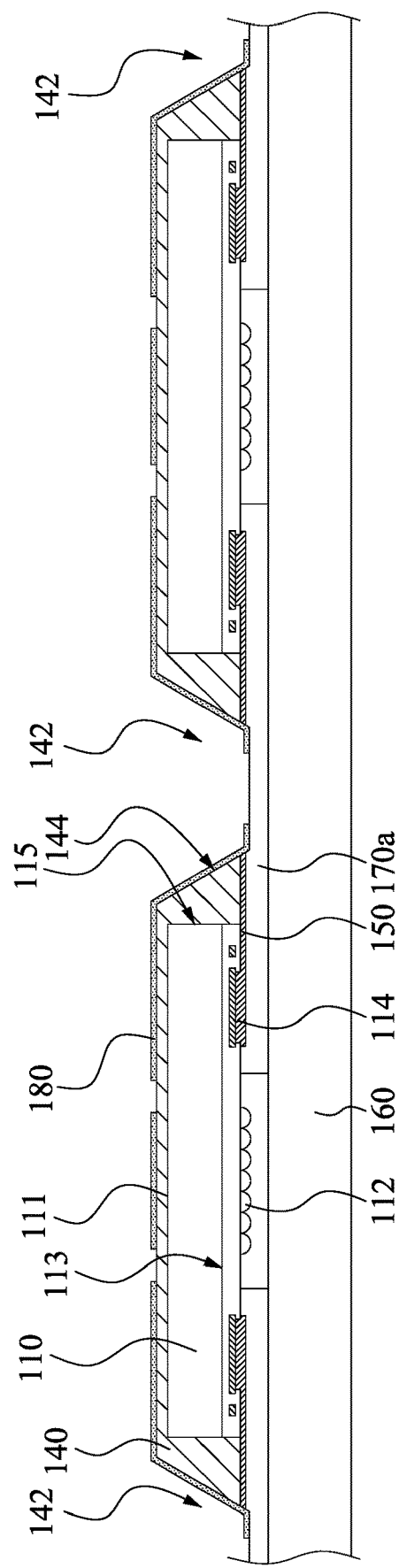

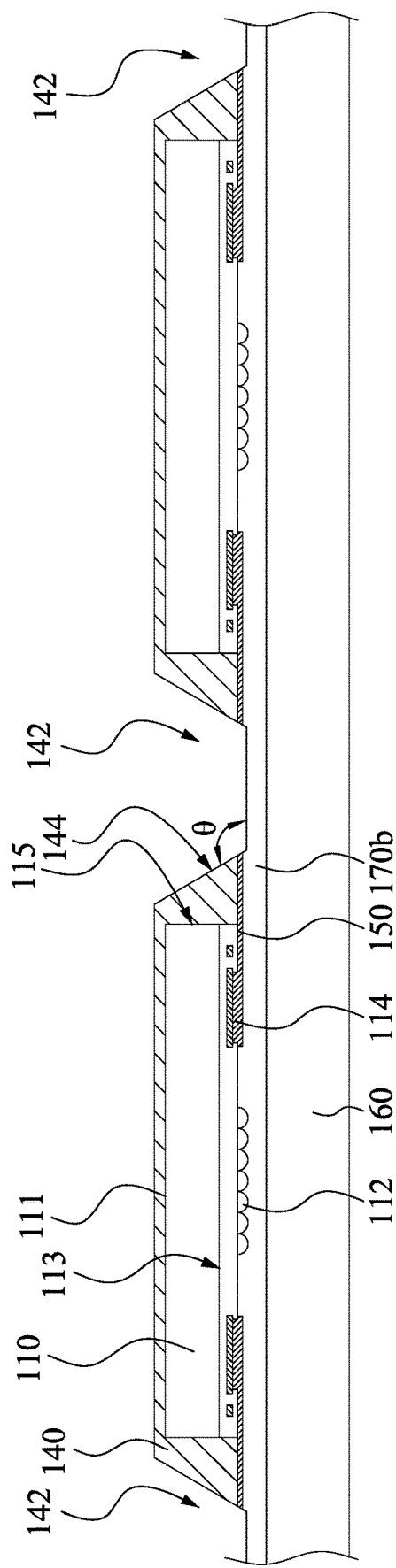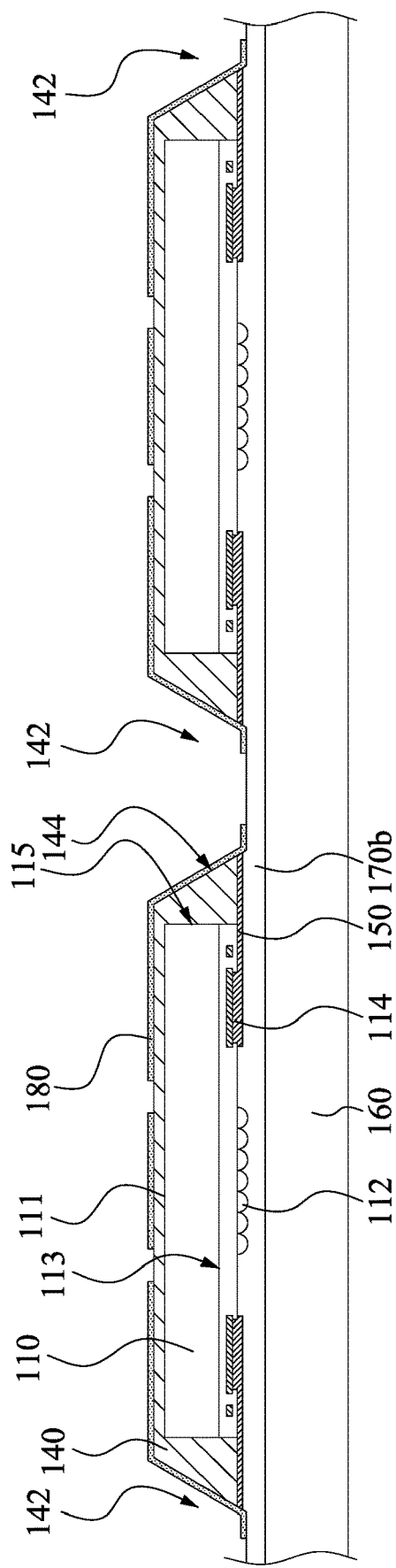

CHIP PACKAGE AND MANUFACTURING METHOD THEREOF

RELATED APPLICATIONS

This application claims priority to U.S. provisional Application Ser. No. 62/582,564, filed Nov. 7, 2017, which is herein incorporated by reference.

BACKGROUND

Field of Invention

The present invention relates to a chip package and a manufacturing method of the chip package.

Description of Related Art

Generally speaking, a chip used as an image sensor or a fingerprint sensor has a front surface on which a sensing area and a conductive pad are located. A redistribution layer extends from the conductive pad to a rear surface of the chip through a lateral surface of chip, thereby achieving a chip package in which solder balls are disposed on the rear surface of the chip. However, a size of the chip package is determined by a size of the chip and the chip is made of silicon, and thus it is difficult to reduce material cost on one hand, and is difficult to adjust the size of the chip package on the other hand.

In addition, before the redistribution layer is formed, an etching process needs to be performed on the chip, so as to form a trench to expose the conductive pad. After an isolation layer is formed to cover the rear surface and the lateral surface of the chip, the redistribution layer electrically connected to the conductive pad can be formed, thereby ensuring that the redistribution layer is electrically conducted to the conductive pad but is not in contact with other portions of the chip to prevent short circuiting. As a result, the fabrication cost of the chip package is hard to be reduced.

SUMMARY

An aspect of the present invention is to provide a chip package.

According to an embodiment of the present invention, a chip package includes a chip structure, a molding material, a conductive layer, a redistribution layer, and a passivation layer. The chip structure has a front surface, a rear surface opposite the front surface, a sidewall adjacent to the front surface and the rear surface, a sensing area, and a conductive pad. The sensing area and the conductive pad are on the front surface. The molding material covers the rear surface and the sidewall of the chip structure. The conductive layer extends from the conductive pad to the molding material that is on the sidewall of the chip structure. The redistribution layer extends from the molding material that is on the rear surface of the chip structure to the molding material that is on the sidewall of the chip structure, and is in electrical contact with an end of the conductive layer facing away from the conductive pad. The passivation layer is on the molding material and the redistribution layer, and has an opening, and a portion of the redistribution layer is located in the opening.

An aspect of the present invention is to provide a manufacturing method of a chip package.

According to an embodiment of the present invention, a manufacturing method of a chip package includes cutting a wafer to form at least one chip structure; bonding the chip structure to a temporary bonding layer that is on a carrier; forming a molding material to cover a rear surface and a sidewall of the chip structure; removing the carrier and the temporary bonding layer; forming a conductive layer that extends from a conductive pad of the chip structure to the molding material that is on the sidewall of the chip structure; forming a trench in the molding material, in which the molding material on the sidewall of the chip structure is between the trench and the chip structure; forming a redistribution layer that extends from the molding material that is on the rear surface of the chip structure to the molding material that is on the sidewall of the chip structure, in which the redistribution layer is in electrical contact with an end of the conductive layer facing away from the conductive pad; forming passivation layer on the molding material and the redistribution layer, and in the trench, in which the passivation layer has an opening, and a portion of the redistribution layer is located in the opening; and cutting the passivation layer along the trench to form at least one chip package.

In the aforementioned embodiments of the present invention, because the rear surface and the sidewall of the chip structure are covered by the molding material and the conductive layer extends from the conductive pad to the molding material that is on the sidewall of the chip structure, the redistribution layer may extend from the molding material that is on the rear surface to the molding material that is on the sidewall to be further in electrical contact with an end of the conductive layer when the redistribution layer is formed. As a result, the size of the chip package may be adjusted by the molding material, and thus material cost may be reduced. Moreover, before the redistribution layer is formed, the chip structure does not need to form a trench to expose the conductive pad, thereby omitting an etching process. In addition, the molding material itself is an insulator. Therefore, the redistribution layer electrically connected to the conductive pad may be formed on the molding material without needing to form an additional isolation layer to cover the rear surface and the sidewall of the chip structure. As a result, fabrication cost of the chip package can be reduced.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows:

FIGS. 1 to 9 are cross-sectional views at various stages of a manufacturing method of a chip package according to one embodiment of the present invention;

FIGS. 10 to 13 are cross-sectional views at various stages of a manufacturing method of a chip package according to one embodiment of the present invention.

DETAILED DESCRIPTION

Figure 1:
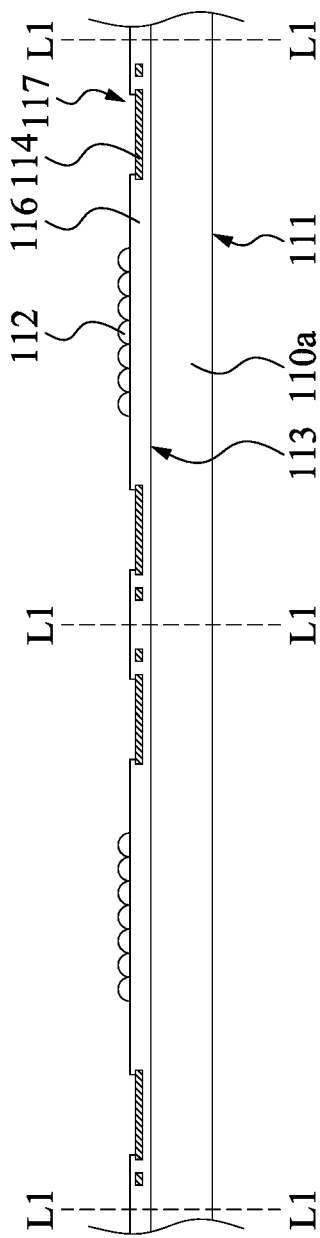

Reference will now be made in detail to the present embodiments of the invention, examples of which are illus- FIGS. 1 to 9 are cross-sectional views at various stages of a manufacturing method of a chip package according to one embodiment of the present invention. As shown in FIG. 1, a wafer 110a has a rear surface 111, a front surface 113 that is opposite the rear surface 111, a sensing area 112, a conductive pad 114, and an isolation layer 116. The sensing area 112, the conductive pad 114 and the isolation layer 116 are located on the front surface 113, and the conductive pad 114 is exposed through an opening 117 of the isolation layer 116. A thickness of the wafer 110a may be reduced by grinding the rear surface 111 of the wafer 110a. Thereafter, the wafer 110a may be cut along lines L1-L1 to form at least one chip structure 110.

As shown in FIG. 2, after the wafer 110a is cut, the chip structure 110 may be bonded to a temporary bonding layer 130 that is on a carrier 120. In other words, the chip structure 110 is adhered to the carrier 120 through the temporary bonding layer 130.

Then, as shown in FIG. 3, a molding material 140 may be formed to cover the rear surface 111 and a sidewall 115 of the chip structure 110. The molding material 140 may be a molding compound, a film, or a tape, but the present invention is not limited thereto. A thickness of the molding material 140 may be reduced through grinding a surface 141 of the molding material 140.

As shown in FIG. 4, after the molding material 140 is formed, the carrier 120 and the temporary bonding layer 130 may be removed. For example, ultraviolet light may be utilized to irradiate the temporary bonding layer 130 so as to eliminate the adhesion of the temporary bonding layer 130, but the present invention is not limited in this regard. After the removal of the carrier 120 and the temporary bonding layer 130, a surface 143 of the molding material 140 and the sensing area 112 and the conductive pad 114 of the chip structure 110 are exposed.

Thereafter, as shown in FIG. 5, a conductive layer 150 electrically connected to the conductive pad 114 may be formed, and the conductive layer 150 extends from the conductive pad 114 to the surface 143 of the molding material 140. In other words, the conductive layer 150 extends to the molding material 140 that is on the sidewall 115 of the chip structure 110. The molding material 140 may be formed by sputtering, but the present invention is not limited in this regard.

As shown in FIG. 6, after the conductive layer 150 is formed, a support element 170a may be formed on a light-transmissive sheet 160. The light-transmissive sheet 160 may be an optical glass, but the present invention is not limited in this regard. Then, the chip structure 110 is bonded to the support element 170a, such that the support element 170a covers the conductive pad 114, the conductive layer 150, and the molding material 140 that is on the sidewall 115, and the light-transmissive sheet 160 covers the sensing area 112 of the chip structure 110. The support element 170a surrounds the sensing area 112 of the chip structure 110. After the chip structure 110 is bonded to the support element 170a, a trench 142 may be formed in the molding material 140 by using a cutter, such that the molding material 140 on the sidewall 115 of the chip structure 110 is located between the trench 142 and the chip structure 110. Through the aforementioned steps, the molding material 140 has a surface 144 facing away from the sidewall 115, a portion of the support element 170a protrudes from the surface 144 of the molding material 140, and an obtuse angle θ is formed between the surface 144 of the molding material 140 and the support element 170a.

As shown in FIG. 7, after the trench 142 of the molding material 140 is formed, a redistribution layer 180 may be formed. The redistribution layer 180 extends from the molding material 140 that is on the rear surface 111 of the chip structure 110 to the molding material 140 that is on the sidewall 115 of the chip structure 110, and the redistribution layer 180 is in electrical contact with an end of the conductive layer 150 facing away from the conductive pad 114. Furthermore, the redistribution layer 180 may extend onto the support element 170a that protrudes from the surface 144 of the molding material 140.

Figure 8:
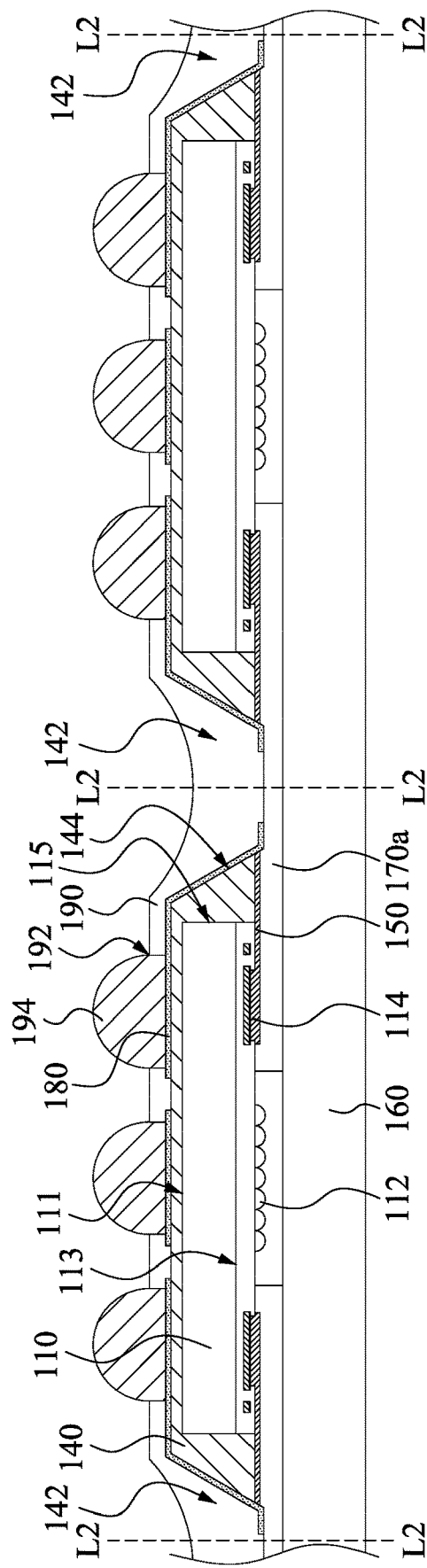

As shown in FIG. 8, after the redistribution layer 180 is formed, a passivation layer 190 may be formed on the molding material 140 and the redistribution layer 180, and in the trench 142. The passivation layer 190 may have an opening 192 formed by patterning, such that a portion of the redistribution layer 180 is located in the opening 192 and is exposed through the opening 192. Moreover, a conductive structure 194 may be formed on the redistribution layer 180 that is in the opening 192. Thereafter, the passivation layer 190, the support element 170a, and the light-transmissive sheet 160 may be cut along the trenches 142 (i.e., lines L2-L2) to form at least one chip package 100a (see FIG. 9).

Figure 9:
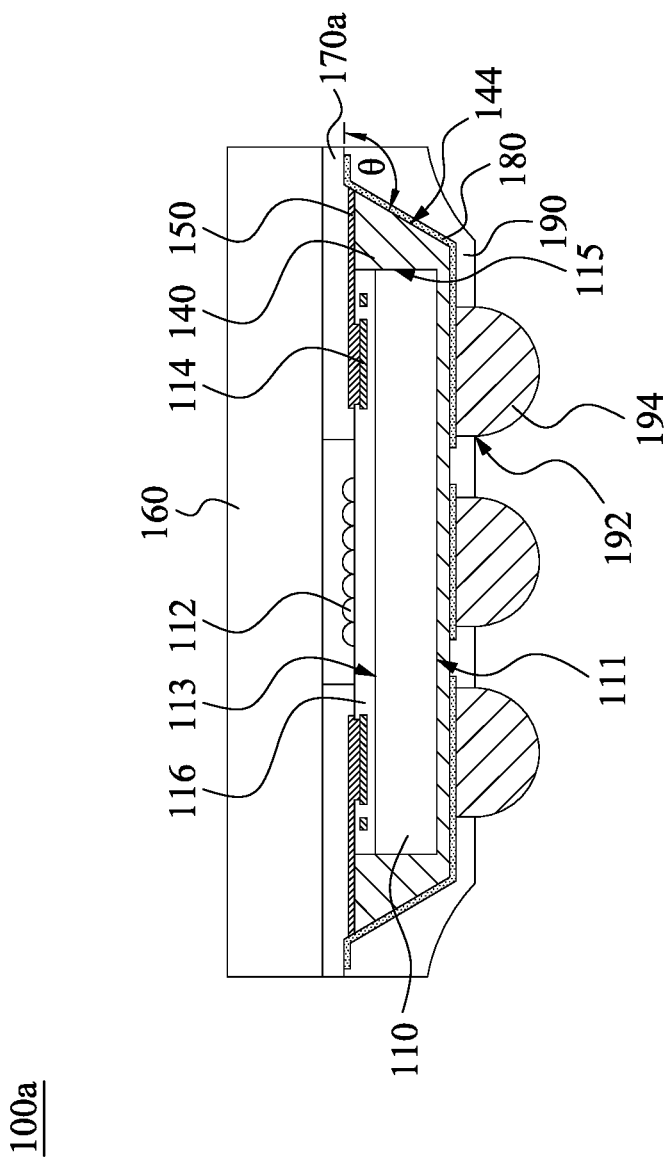

As shown in FIG. 9, the chip package 100a includes the chip structure 110, the molding material 140, the conductive layer 150, the redistribution layer 180, and the passivation layer 190. The chip structure 110 has the front surface 113, the rear surface 111 opposite the front surface 113, the sidewall 115 adjacent to the front surface 113 and the rear surface 111, the sensing area 112, and the conductive pad 114. The sensing area 112 and the conductive pad 114 are on the front surface 113. The molding material 140 covers the rear surface 111 and the sidewall 115 of the chip structure 110. The molding material 140 surrounds the sidewall 115 and is in contact with the rear surface 111 and the sidewall 115 of the chip structure 110. The conductive layer 150 extends from the conductive pad 114 to the molding material 140 that is on the sidewall 115. The redistribution layer 180 extends from the molding material 140 that is on the rear surface 111 to the molding material 140 that is on the sidewall 115, and is in electrical contact with an end of the conductive layer 150 facing away from the conductive pad 114. The passivation layer 190 is on the molding material 140 and the redistribution layer 180, and has an opening 192, and a portion of the redistribution layer 180 is located in the opening 192.

Because the rear surface 111 and the sidewall 115 of the chip structure 110 are covered by the molding material 140 and the conductive layer 150 extends from the conductive pad 114 to the molding material 140 that is on the sidewall 115 of the chip structure 110, the redistribution layer 180 may extend from the molding material 140 that is on the rear surface 111 to the molding material 140 that is on the sidewall 115 to be further in electrical contact with an end of the conductive layer 150 when the redistribution layer 180 is formed. As a result, the size of the chip package 100a may be modified by the molding material 140, and thus material cost may be reduced. Moreover, before the redistribution layer 180 is formed, the chip structure 110 does not need to form a trench to expose the conductive pad 114, thereby omitting an etching process. In addition, the molding material 140 itself is an insulator. Therefore, the redistribution layer 180 electrically connected to the conductive pad 114 may be formed on the molding material 140 without needing to form an additional isolation layer to cover the rear surface 111 and the sidewall 115 of the chip structure 110. As a result, fabrication cost of the chip package 100a can be reduced.

In this embodiment, the chip package 100a may further include the conductive structure 194 that is on the redistribution layer 180. The conductive structure 194 may be used to electrically connect a connection pad of an external electronic element (e.g., a printed circuit board), and such a design is referred to as a ball grid array (BGA). However, in another embodiment, the chip package 100a may have no conductive structure 194, and the redistribution layer 180 exposed through the opening 192 of the passivation layer 190 may be used to electrically connect a conductive structure of an external electronic element (e.g., a printed circuit board), and such a design is referred to as a land grid array (LGA).

In this embodiment, the chip package 100a may further include the support element 170a and the light-transmissive sheet 160. The support element 170a covers the conductive pad 114, the conductive layer 150, and the molding material 140 that is on the sidewall 115, and surrounds the sensing area 112. A portion of the support element 170a protrudes from the surface 114 of the molding material 140, and the redistribution layer 180 extends to the portion of the support element 170a. The light-transmissive sheet 160 is on the support element 170a and covers the sensing area 112. However, in another embodiment, a temporary bonding layer may be disposed between the support element 170a and the light-transmissive sheet 160, such that the support element 170a may be removed from the chip package 100a after the cutting process of FIG. 8.

It is to be noted that the connection relationships, materials, and advantages of the elements described above will not be repeated in the following description, and only aspects related to other types of chip packages and manufacturing methods thereof will be described hereinafter.

FIGS. 10 to 13 are cross-sectional views at various stages of a manufacturing method of a chip package according to one embodiment of the present invention. After the structure of FIG. 5 is formed, steps from FIG. 10 to FIG. 13 may be performed. As shown in FIG. 10, an optical clear adhesive 170b may be formed on the light-transmissive sheet 160. Thereafter, the optical clear adhesive 170b is used to cover the sensing area 112, the conductive pad 114, the conductive layer 150, and the molding material 140 that is on the sidewall 115, and the optical clear adhesive 170b is between the light-transmissive sheet 160 and the chip structure 110. After the chip structure 110 is bonded to the light-transmissive sheet 160, the trench 142 may be formed in the molding material 140, such that the molding material 140 on the sidewall 115 of the chip structure 110 is located between the trench 142 and the chip structure 110. Through the aforementioned steps, the molding material 140 has the surface 114 facing away from the sidewall 115, and a portion of the optical clear adhesive 170b protrudes from the surface 114 of the molding material 140, and an obtuse angle θ is formed between the surface 144 of the molding material 140 and the optical clear adhesive 170b.

As shown in FIG. 11, after the trench 142 of the molding material 140 is formed, the redistribution layer 180 may be formed. The redistribution layer 180 extends from the molding material 140 that is on the rear surface 111 of the chip structure 110 to the molding material 140 that is on the sidewall 115 of the chip structure 110, and the redistribution layer 180 is in electrical contact with an end of the conductive layer 150 facing away from the conductive pad 114. Furthermore, the redistribution layer 180 may extend onto the optical clear adhesive 170b that protrudes from the surface 144 of the molding material 140.

Figure 12:
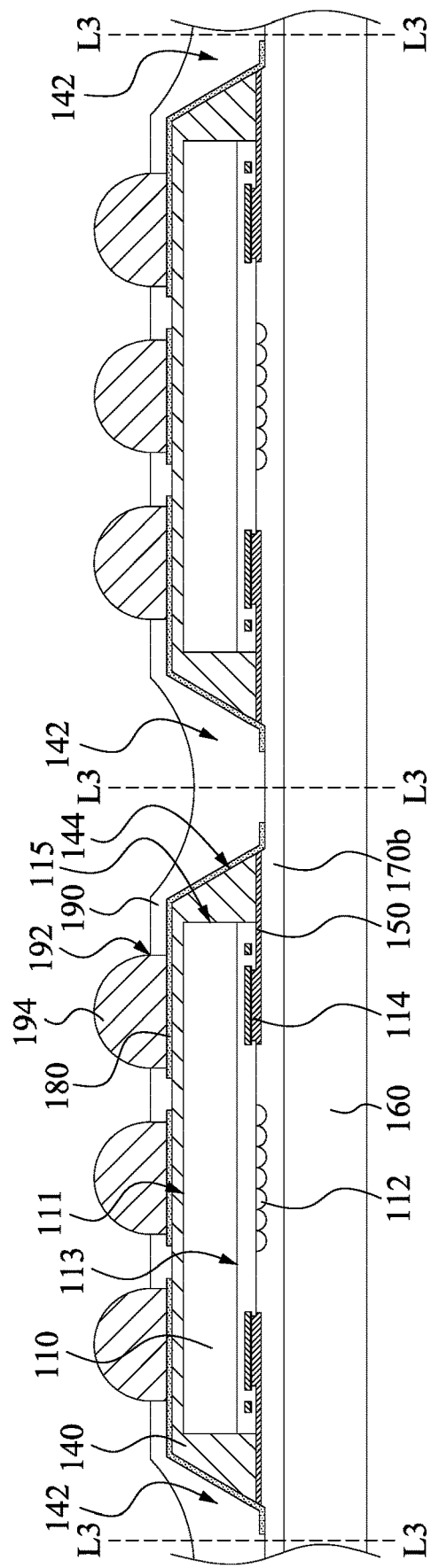

As shown in FIG. 12, after the redistribution layer 180 is formed, the passivation layer 190 may be formed on the molding material 140 and the redistribution layer 180, and in the trench 142. The passivation layer 190 may have an opening 192 formed by patterning, such that a portion of the redistribution layer 180 is located in the opening 192 and is exposed through the opening 192. Moreover, the conductive structure 194 may be formed on the redistribution layer 180 that is in the opening 192. Thereafter, the passivation layer 190, the optical clear adhesive 170b, and the light-transmissive sheet 160 may be cut along the trench 142 (i.e., lines L3-L3) to form at least one chip package 100b (see FIG. 13).

Figure 13:
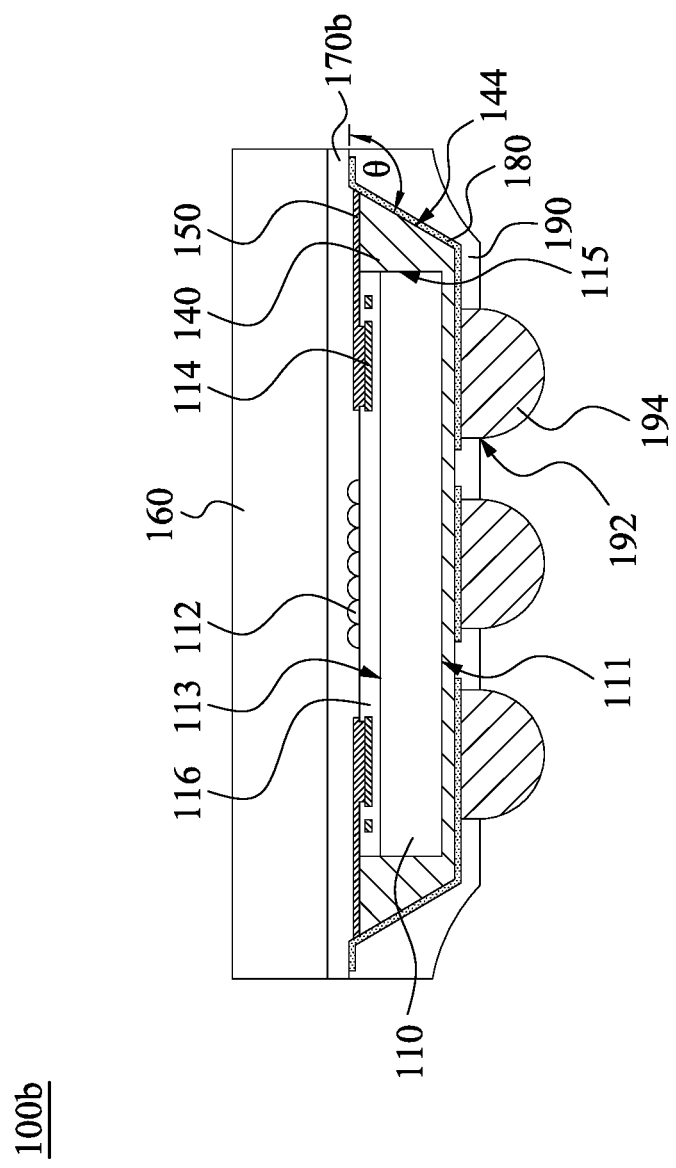

As shown in FIG. 13, the chip package 100b includes the chip structure 110, the molding material 140, the conductive layer 150, the redistribution layer 180, the passivation layer 190, the conductive structure 194, the optical clear adhesive 170b, and the light-transmissive sheet 160. The difference between this embodiment and the embodiment shown in FIG. 9 is that the chip package 100b has the optical clear adhesive 170b and has no support element 170a. The optical clear adhesive 170b covers the sensing area 112, the conductive pad 114, the conductive layer 150, and the molding material 140 that is on the sidewall 115. A portion of the optical clear adhesive 170b protrudes from the surface 144 of the molding material 140, and the redistribution layer 180 extends onto the portion of the optical clear adhesive 170b. The light-transmissive sheet 160 covers the optical clear adhesive 170b. The obtuse angle 9 is formed between the surface 144 of the molding material 140 and the optical clear adhesive 170b. In addition, in another embodiment, the chip package 100b may have no conductive structure 194 and the light-transmissive sheet 160 may be removed as deemed necessary by designers.

Figure 14:
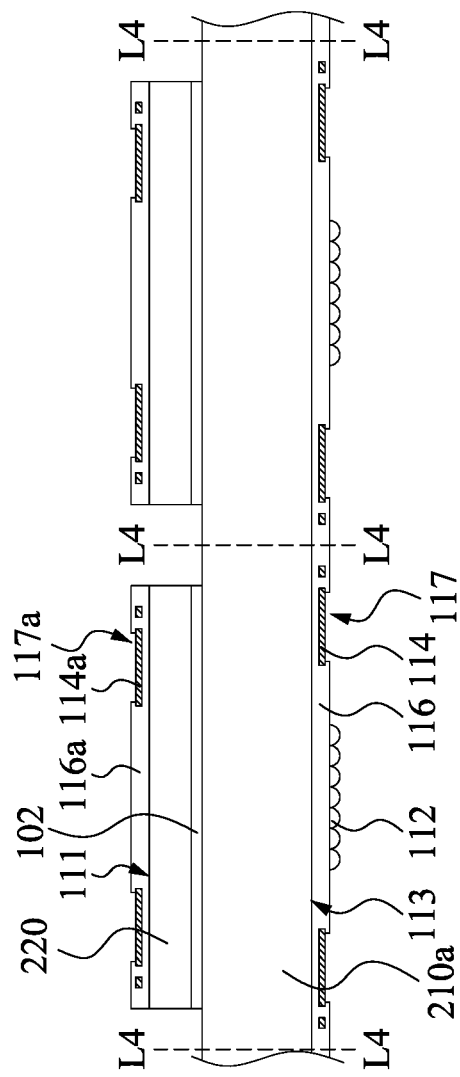
FIGS. 14 to 23 are cross-sectional views at various stages of a manufacturing method of a chip package according to one embodiment of the present invention.
Figure 15:
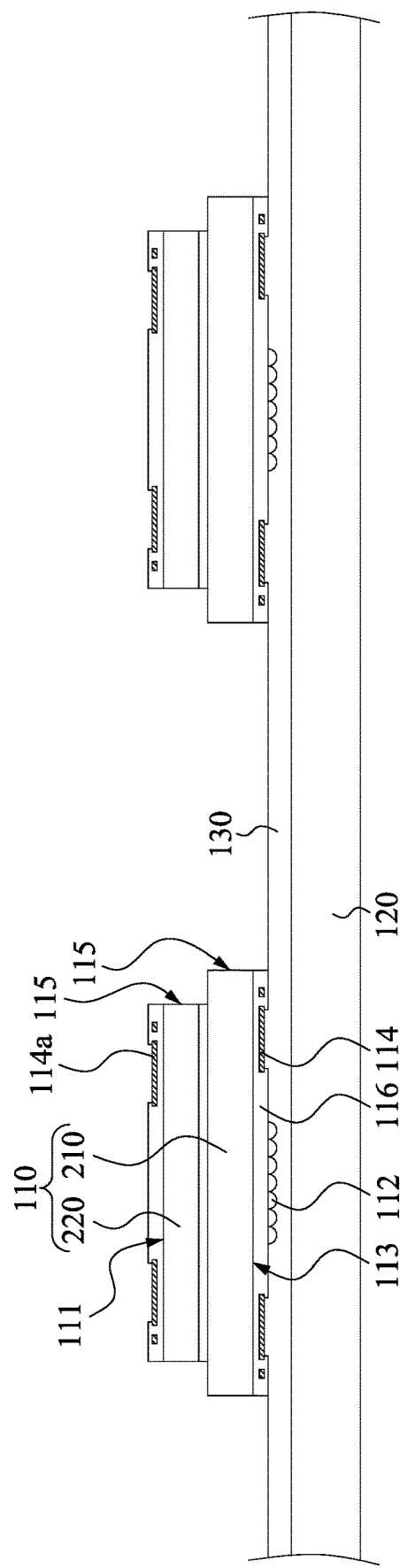

FIGS. 14 to 23 are cross-sectional views at various stages of a manufacturing method of a chip package according to one embodiment of the present invention. As shown in FIG. 14 and FIG. 15, at least one chip 220 is bonded to a wafer 210a through an adhesive layer 102. The wafer 210a has a sensing area 112, a conductive pad 114, and an isolation layer 116, and the conductive pad 114 is exposed through an opening 117 of the isolation layer 116. The chip 220 has a conductive pad 114a and an isolation layer 116a, and the conductive pad 114a is exposed through an opening 117a of the isolation layer 116a. Thereafter, the wafer 210a is cut along lines L4-L4 to form a chip structure 110 that has a chip 210 and the chip 220. The chip 210 has a front surface 113 of the chip structure 110, and the chip 220 has a rear surface 111 of the chip structure 110.

As shown in FIG. 15, after the wafer 210a is cut, the chip structure 110 may be bonded to a temporary bonding layer 130 that is on a carrier 120. In other words, the chip structure 110 is adhered to the carrier 120 through the temporary bonding layer 130.

Figure 16:
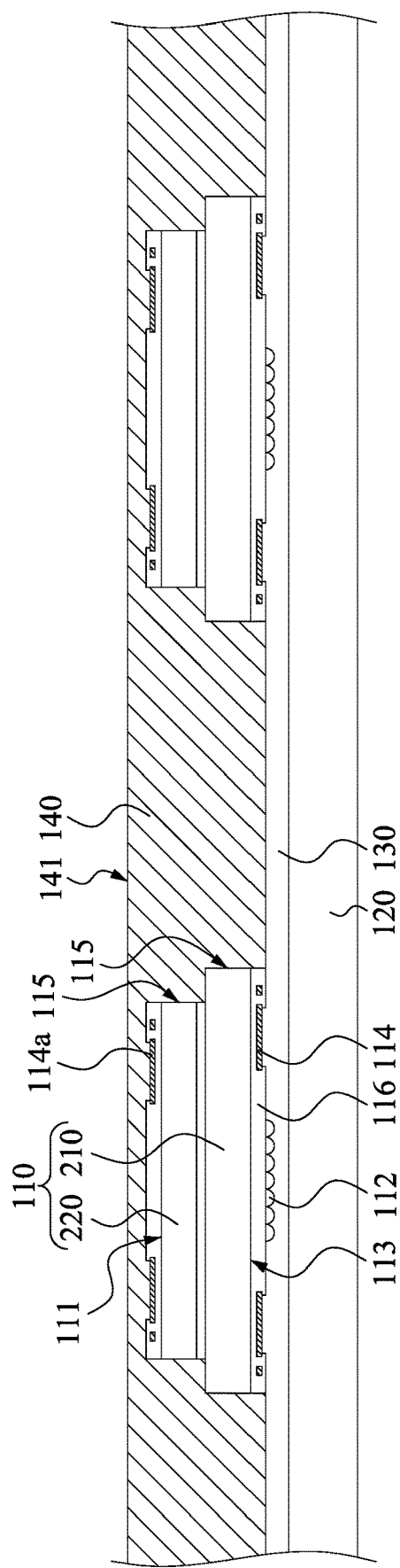

Then, as shown in FIG. 16, a molding material 140 may be formed to cover the rear surface 111 and a sidewall 115 of the chip structure 110, such that the chip 220 is covered by the molding material 140. A thickness of the molding material 140 may be reduced by grinding a surface 141 of the molding material 140.

Figure 17:
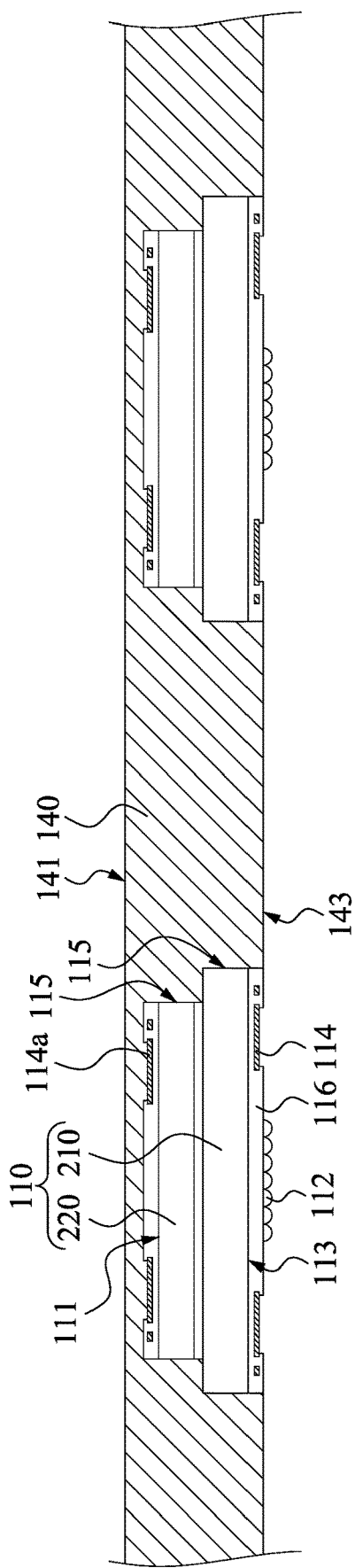

As shown in FIG. 17, after the molding material 140 is formed, the carrier 120 and the temporary bonding layer 130 may be removed. After the removal of the carrier 120 and the temporary bonding layer 130, a surface 143 of the molding material 140 and the sensing area 112 and the conductive pad 114 of the chip 210 of the chip structure 110 may be exposed.

Figure 18:
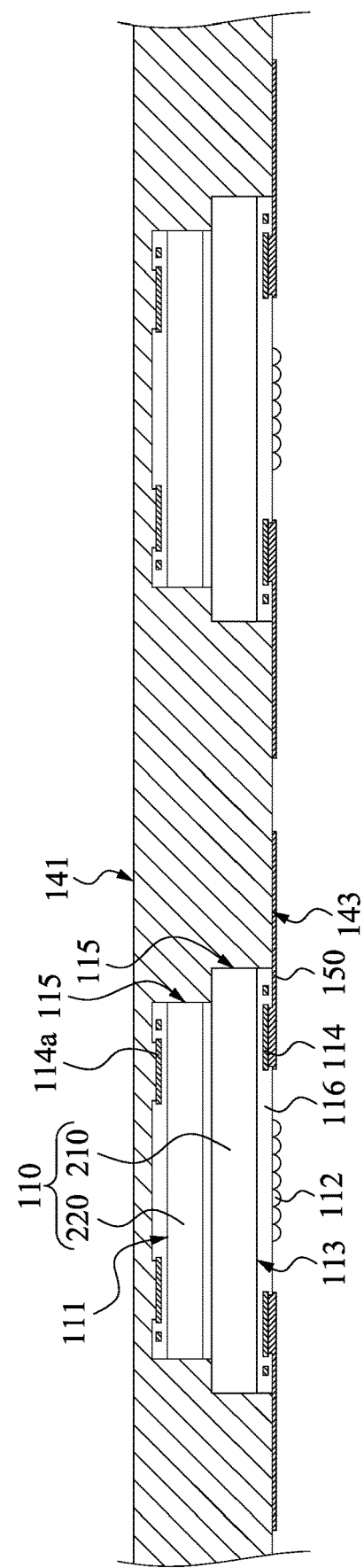

Thereafter, as shown in FIG. 18, a conductive layer 150 electrically connected to the conductive pad 114 of the chip 210 may be formed, and the conductive layer 150 extends from the conductive pad 114 to the surface 143 of the molding material 140. In other words, the conductive layer 150 extends to the molding material 140 that is on the sidewall 115 of the chip structure 110.

Figure 19:
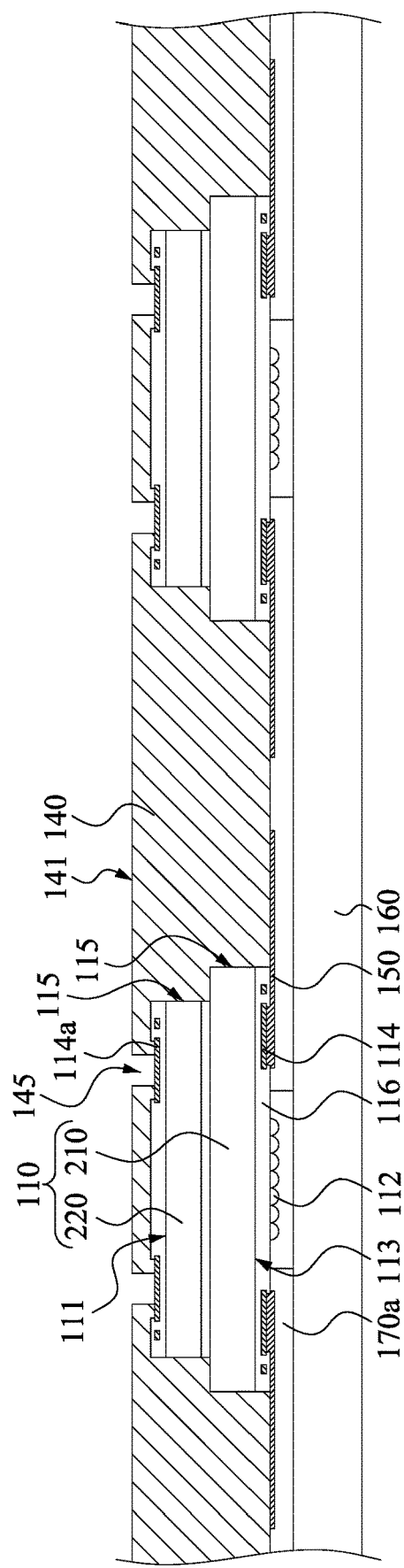

As shown in FIG. 19, after the conductive layer 150 is formed, a support element 170a may be formed on a light-transmissive sheet 160. Then, the chip structure 110 is bonded to a support element 170a, such that the support element 170a covers the conductive pad 114, the conductive layer 150, and the molding material 140 that is on the sidewall 115, and the light-transmissive sheet 160 covers the sensing area 112 of the chip 210 of of the chip structure 110. The support element 170a surrounds the sensing area 112 of the chip 210 of the chip structure 110.

After the chip structure 110 is bonded to the support element 170a, an opening 145 is formed in the molding material 140, such that the conductive pad 114a of the chip 220 is exposed through the opening 145 of the molding material 140. The opening 145 of the molding material 140 may be formed by laser drilling or etching.

Figure 20:
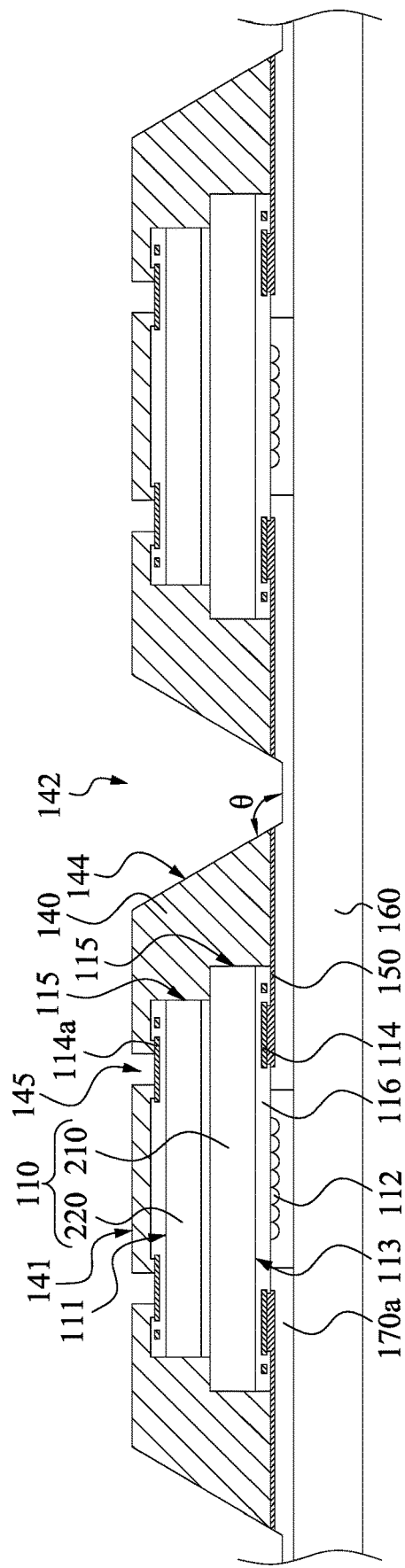

Then, as shown in FIG. 20, a trench 142 may be formed in the molding material 140, such that the molding material 140 on the sidewall 115 of the chip structure 110 is located between the trench 142 and the chip structure 110. Through the aforementioned steps, the molding material 140 has a surface 144 facing away from the sidewall 115, a portion of the support element 170a protrudes from the surface 144 of the molding material 140, and an obtuse angle θ is formed between the surface 144 of the molding material 140 and the support element 170a.

Figure 21:
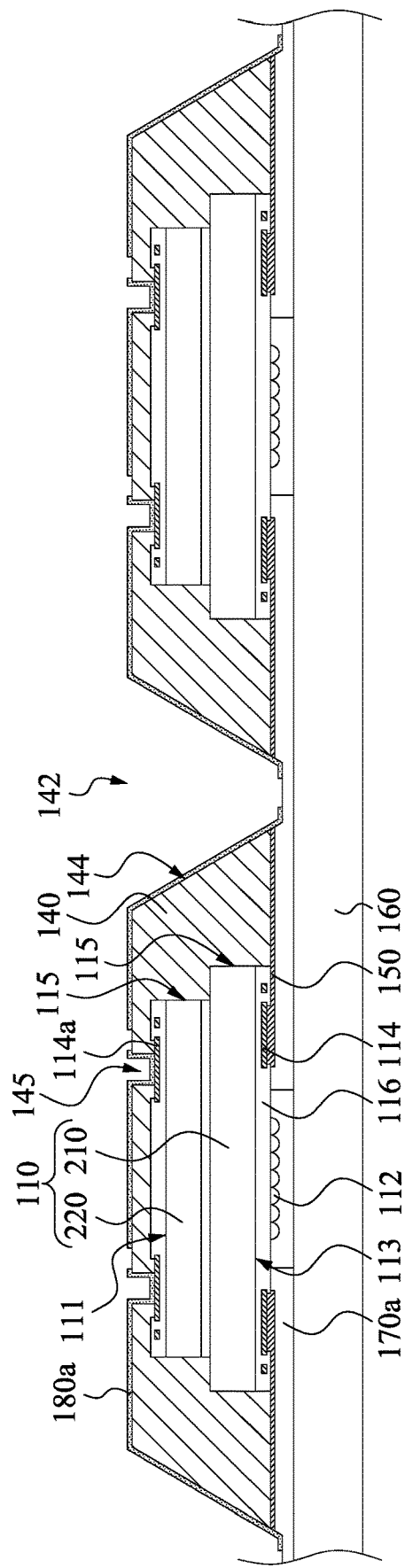

As shown in FIG. 21, after the trench 142 of the molding material 140 is formed, a redistribution layer 180a may be formed. The redistribution layer 180a extends from the molding material 140 that is on the rear surface 111 of the chip structure 110 to the molding material 140 that is on the sidewall 115 of the chip structure 110, and the redistribution layer 180a is in electrical contact with an end of the conductive layer 150 facing away from the conductive pad 114. Furthermore, the redistribution layer 180a may extend onto the support element 170a that protrudes from the surface 144 of the molding material 140, and extends onto the conductive pad 114a of the chip 220 through the opening 145 of the molding material 140.

Figure 22:
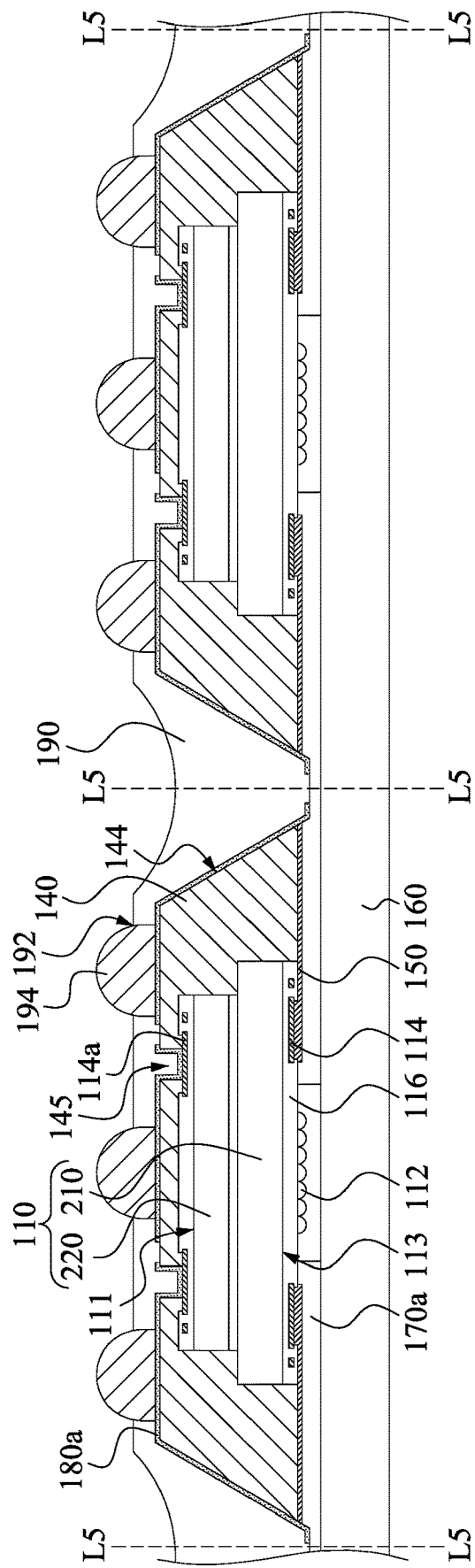

As shown in FIG. 22, after the redistribution layer 180a is formed, a passivation layer 190 may be formed on the molding material 140 and the redistribution layer 180a, and in the trench 142. The passivation layer 190 may have an opening 192 formed by patterning, such that a portion of the redistribution layer 180a is located in the opening 192 and is exposed through the opening 192. Moreover, a conductive structure 194 may be further formed on the redistribution layer 180a that is in the opening 192. Thereafter, the passivation layer 190, the support element 170a, and the light-transmissive sheet 160 may be cut along the trench 142 (i.e., lines L5-L5) to form at least one chip package 100c (see FIG. 23).

Figure 23:
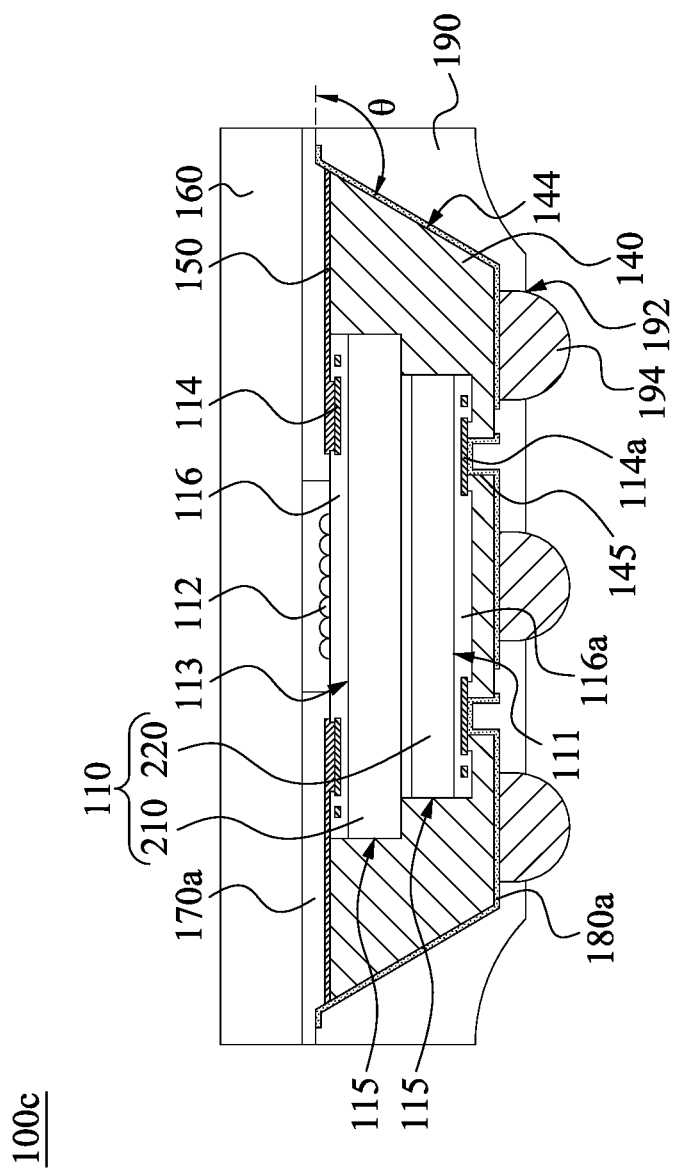

As shown in FIG. 23, the chip package 100c includes the chip structure 110, the molding material 140, the conductive layer 150, the redistribution layer 180a, the passivation layer 190, the conductive structure 194, the support element 170a, and the light-transmissive sheet 160. The difference between this embodiment and the embodiment shown in FIG. 9 is that the chip package 100c has the stacked chips 210 and 220. The chip 220 is bonded to the chip 210. The front surface 113 of the chip structure 110 is formed by the chip 210, and the rear surface 111 of the chip structure 110 is formed by the chip 220. The rear surface 111 of the chip 220 has the conductive pad 114a, the molding material 140 has the opening 145, the conductive pad 114a is in the opening 145 of the molding material 140, and the redistribution layer 180a extends onto the conductive pad 114a of the chip 220 through the opening 145 of the molding material 140. In addition, in another embodiment, the chip package 100c may have no conductive structure 194, the light-transmissive sheet 160 may be removed, and the support element 170a may be replaced with the optical clear adhesive 170b of FIG. 13, as deemed necessary by designers.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A chip package, comprising:
   a chip structure having a front surface, a rear surface opposite the front surface, a sidewall adjacent to the front surface and the rear surface, and a sensing area and a conductive pad that are on the front surface;
   a molding material covering the rear surface and the sidewall of the chip structure;
   a conductive layer extending from the conductive pad to the molding material that is on the sidewall of the chip structure;
   a redistribution layer extending from the molding material that is on the rear surface of the chip structure to the molding material that is on the sidewall of the chip structure, wherein the redistribution layer is in electrical contact with an end of the conductive layer facing away from the conductive pad;
   a passivation layer on the molding material and the redistribution layer, the passivation layer having an opening, wherein a portion of the redistribution layer is located in the opening; and
   a support element covering the conductive pad, the conductive layer, and the molding material that is on the sidewall of the chip structure, the support element surrounding the sensing area, wherein a portion of the support element protrudes from a surface of the molding material facing away from the sidewall, and the redistribution layer extends to the portion of the support element.

2. The chip package of claim 1, wherein the molding material surrounds the sidewall of the chip structure, and is in contact with the rear surface and the sidewall of the chip structure.

3. The chip package of claim 1, further comprising:
   a conductive structure on the portion of the redistribution layer.

4. The chip package of claim 1, further comprising:
   a light-transmissive sheet on the support element and covering the sensing area.

5. The chip package of claim 1, wherein an obtuse angle is formed between the support element and the surface of the molding material facing away from the sidewall.

6. A chip package, comprising:
a chip structure having a front surface, a rear surface opposite the front surface, a sidewall adjacent to the front surface and the rear surface, and a sensing area and a conductive pad that are on the front surface;
a molding material covering the rear surface and the sidewall of the chip structure;
a conductive layer extending from the conductive pad to the molding material that is on the sidewall of the chip structure;
a redistribution layer extending from the molding material that is on the rear surface of the chip structure to the molding material that is on the sidewall of the chip structure, wherein the redistribution layer is in electrical contact with an end of the conductive layer facing away from the conductive pad;
a passivation layer on the molding material and the redistribution layer, the passivation layer having an opening, wherein a portion of the redistribution layer is located in the opening; and
an optical clear adhesive covering the sensing area, the conductive pad, the conductive layer, and the molding material that is on the sidewall, wherein a portion of the optical clear adhesive protrudes from a surface of the molding material facing away from the sidewall, and the redistribution layer extends to the portion of the optical clear adhesive.

7. The chip package of claim 6, further comprising:
a light-transmissive sheet covering the optical clear adhesive.

8. The chip package of claim 6, wherein an obtuse angle is formed between the optical clear adhesive and the surface of the molding material facing away from the sidewall.

9. A chip package, comprising:
a chip structure having a front surface, a rear surface opposite the front surface, a sidewall adjacent to the front surface and the rear surface, and a sensing area and a conductive pad that are on the front surface, wherein the chip structure comprises:
a first chip forming the front surface of the chip structure; and
a second chip that is bonded to the first chip and forms the rear surface of the chip structure;
a molding material covering the rear surface and the sidewall of the chip structure;
a conductive layer extending from the conductive pad to the molding material that is on the sidewall of the chip structure;
a redistribution layer extending from the molding material that is on the rear surface of the chip structure to the molding material that is on the sidewall of the chip structure, wherein the redistribution layer is in electrical contact with an end of the conductive layer facing away from the conductive pad; and
a passivation layer on the molding material and the redistribution layer, the passivation layer having an opening, wherein a portion of the redistribution layer is located in the opening.

10. The chip package of claim 9, wherein the rear surface of the second chip has a conductive pad, the molding material has an opening, the conductive pad of the second chip disposed is in the opening of the molding material, and the redistribution layer extends to the conductive pad of the second chip through the opening of the molding material.

11. A manufacturing method of a chip package, the manufacturing method comprising:
cutting a wafer to form at least one chip structure;
bonding the chip structure to a temporary bonding layer that is on a carrier;
forming a molding material to cover a rear surface and a sidewall of the chip structure;
removing the carrier and the temporary bonding layer;
forming a conductive layer that extends from a conductive pad of the chip structure to the molding material that is on the sidewall of the chip structure;
forming a trench in the molding material, wherein the molding material on the sidewall of the chip structure is between the trench and the chip structure;
forming a redistribution layer that extends from the molding material that is on the rear surface of the chip structure to the molding material that is on the sidewall of the chip structure, wherein the redistribution layer is in electrical contact with an end of the conductive layer facing away from the conductive pad;
forming passivation layer on the molding material and the redistribution layer, and in the trench, wherein the passivation layer has an opening, and a portion of the redistribution layer is located in the opening; and
cutting the passivation layer along the trench to form at least one chip package.

12. The manufacturing method of claim 11, further comprising:
forming a conductive structure on the portion of the redistribution layer.

13. The manufacturing method of claim 11, further comprising:
forming a support element on a light-transmissive sheet; and
covering the conductive pad, the conductive layer, and the molding material that is on the sidewall by the support element, wherein the support element surrounds a sensing area of the chip structure, a portion of the support element protrudes from a surface of the molding material facing away from the sidewall, and the light-transmissive sheet covers the sensing area.

14. The manufacturing method of claim 13, wherein forming the redistribution layer further comprises:
forming the redistribution layer that extends onto the portion of the support element.

15. The manufacturing method of claim 11, further comprising:
forming an optical clear adhesive on a light-transmissive sheet; and
covering the sensing area, the conductive pad, the conductive layer, and the molding material that is on the sidewall by the optical clear adhesive, wherein a portion of the optical clear adhesive protrudes from a surface of the molding material facing away from the sidewall, and the optical clear adhesive is between the light-transmissive sheet and the chip structure.

16. The manufacturing method of claim 15, wherein forming the redistribution layer further comprises:
forming the redistribution layer that extends onto the portion of the optical clear adhesive.

17. The manufacturing method of claim 11, further comprising:
bonding at least one chip to the wafer, such that the chip structure formed by cutting the wafer has a first chip and a second chip, wherein the first chip has a front surface of the chip structure, and the second chip has the rear surface of the chip structure.

18. The manufacturing method of claim 17, wherein forming the molding material further comprises:
   using the molding material to cover the second chip.

19. The manufacturing method of claim 18, wherein the rear surface of the second chip has a conductive pad, the manufacturing method further comprising:
   forming an opening in the molding material such that the conductive pad of the second chip is exposed through the opening of the molding material; and
   forming the redistribution layer that extends onto the conductive pad of the second chip.

* * * * *